(12) United States Patent
Kim et al.

(10) Patent No.: US 7,420,212 B2
(45) Date of Patent: Sep. 2, 2008

(54) FLAT PANEL DISPLAY

(75) Inventors: Deuk-Jong Kim, Seoul (KR); Eui-Hoon Hwang, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 58 days.

(21) Appl. No.: 10/992,215

(22) Filed: Nov. 19, 2004

(65) Prior Publication Data

US 2005/0116232 A1    Jun. 2, 2005

(30) Foreign Application Priority Data

Nov. 28, 2003    (KR) ........................ 10-2003-0085845

(51) Int. Cl.
  *H01L 29/04*  (2006.01)
  *H01L 31/036* (2006.01)
  *H01L 33/00*  (2006.01)
  *H01L 31/20*  (2006.01)

(52) U.S. Cl. .............................. 257/72; 257/59; 257/40; 257/88; 257/E27.132

(58) Field of Classification Search ................ 257/59, 257/72, 40, 88, E27.132
  See application file for complete search history.

(56) References Cited

U.S. PATENT DOCUMENTS

| 6,317,173 | B1 * | 11/2001 | Jung et al. ................. 349/42 |
| 6,521,913 | B1 * | 2/2003 | Murade ....................... 257/59 |
| 6,654,094 | B2 * | 11/2003 | Wu ............................ 349/187 |
| 6,765,231 | B2 * | 7/2004 | Yamazaki .................... 257/72 |
| 6,825,496 | B2 * | 11/2004 | Yamazaki et al. ........... 257/72 |
| 2001/0017372 | A1 * | 8/2001 | Koyama ....................... 257/72 |
| 2002/0158995 | A1 * | 10/2002 | Hwang et al. ............... 349/43 |
| 2003/0227021 | A1 * | 12/2003 | Yamazaki et al. ........... 257/83 |
| 2004/0004224 | A1 * | 1/2004 | Han ............................ 257/88 |

FOREIGN PATENT DOCUMENTS

| JP | 2002-318555 | 10/2002 |
| KR | 10-2000-0072230 | 12/2000 |
| KR | 10-2003-0037654 | 5/2003 |

* cited by examiner

*Primary Examiner*—Shouxiang Hu
(74) *Attorney, Agent, or Firm*—H.C. Park & Associates, PLC

(57) ABSTRACT

A flat panel display and method for fabricating the same are disclosed. The flat panel display includes a substrate. Signal lines are arranged on the substrate in a matrix shape, and a unit pixel region defined by crossing arrangement of the signal lines, has a pixel driving circuit region and an emission region. A pixel driving TFT positioned in the pixel driving circuit region, includes a semiconductor layer and a gate electrode corresponding to a predetermined portion of the semiconductor layer. The gate electrode is formed on a same layer as the signal lines. A pixel electrode, electrically connected to the pixel driving TFT, is positioned in the emission region.

24 Claims, 9 Drawing Sheets

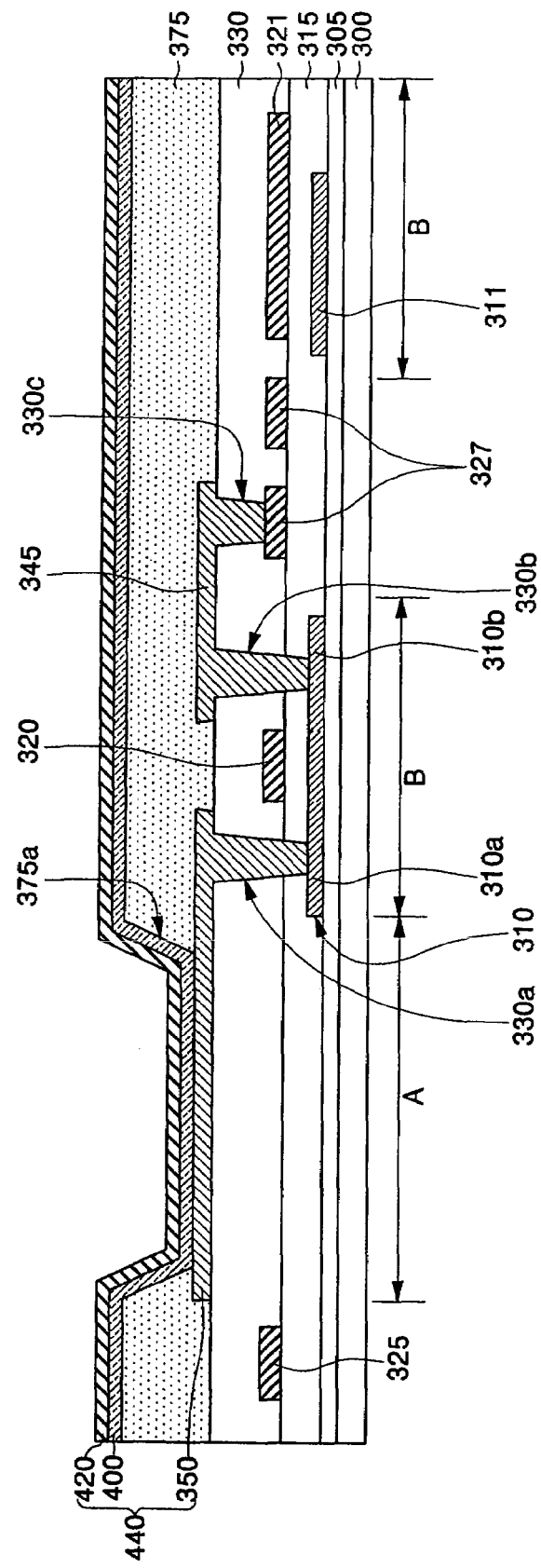

FLAT PANEL DISPLAY

CROSS REFERENCE TO RELATED APPLICATION

This application claims priority to Korean Patent Application No. 2003-85845, filed Nov. 28, 2003, the disclosure of which is herein incorporated by reference in its entirety.

BACKGROUND OF THE INVENTION

1. Field of the Invention

The present invention relates to a flat panel display and, more particularly, to an organic electroluminescent display and method for fabricating the same.

2. Description of the Related Art

An organic electroluminescent display (hereinafter referred to as an OLED) is an emissive display that electrically excites fluorescent organic compounds to emit light. An OLED may be classified as a passive-matrix type or an active-matrix type depending on what method is used to drive a matrix of N×M pixels (where, N and M are integers). An active matrix OLED consumes less power than the passive matrix type and has a higher resolution. Thus, it is used for display devices having a large viewing area.

FIG. 1 shows a plan view of a unit pixel region used in a conventional active matrix OLED.

Referring to FIG. 1, a scan line 125 is formed on a substrate and oriented in one direction. A data line 135 and a parallel common power line 131 cross the scan line 125. Both the data line 135 and the common power line 131 are insulated from the scan line 125.

Each unit pixel region includes a switching TFT (thin film transistor) 140 for switching a data signal applied to the data line 135 in response to a signal applied to the scan line 125, a capacitor 145 for maintaining the data signal applied through the switching TFT 140 for a predetermined period, and a pixel driving TFT 150 for allowing current to flow to a pixel electrode 170 by means of the data signal applied through the switching TFT 140. An emission layer (not shown) is formed on the pixel electrode 170, and an opposite electrode (not shown) is formed on the emission layer. As a result, an organic light emitting diode is formed to have the pixel electrode 170, the emission layer and the opposite electrode.

FIG. 2 shows a cross-sectional view illustrating a conventional method for fabricating the OLED taken along the line 1-1 of FIG. 1.

Referring to FIG. 2, a buffer layer 105 is formed on a substrate 100. A semiconductor layer 110 is formed on the buffer layer 105 using a first mask. A gate insulating layer 115 is formed on an entire surface of the substrate where the semiconductor layer 110 is already formed, and a gate electrode 120 is formed on the gate insulating layer 115 using a second mask.

Next, an interlayer 125 is formed on the entire surface of the substrate where the gate electrode 120 is already formed, and source/drain contact holes 125a are formed within the interlayer 125 to expose both ends of the semiconductor layer 110 using a third mask. Source/drain electrodes 130a, a data line 135, and a common power line 131 are then formed on the interlayer 125 using a fourth mask. The source/drain electrodes 130a are connected to the both ends of the semiconductor layer 110 through the source/drain contact holes 125a, respectively.

A via hole insulating layer 160 is formed on the entire surface including the source/drain electrodes 130a, and a via hole 160a is formed within the via hole insulating layer 160 to expose one of the source/drain electrodes 130a using a fifth mask. A pixel electrode 170 may then be formed on the via hole insulating layer 160 using a sixth mask. The pixel electrode 170 is connected to the source/drain electrode 130a exposed through the via hole 160a. A pixel defining layer 175 may then be formed to cover the pixel electrode 170, and an opening 175a is formed within the pixel defining layer 175 to expose the pixel electrode 170 using a seventh mask.

An organic emission layer 200 may then be formed on the entire surface of the substrate including the pixel electrode 170 exposed within the opening 175a, and an opposite electrode 220 is formed on the organic emission layer 200, so that the OLED is fabricated.

Thus, seven masks are required to fabricate the OLED in accordance with the prior art. Additionally, processes of forming a via hole 160a for connecting the pixel electrode 170 to the source/drain electrode 130a and forming a via hole insulating layer 160 are required. Such complicated processes increase the cost for fabricating the mask and the cost of production.

SUMMARY OF INVENTION

The present invention provides a flat panel display and method for fabricating the same, which reduces the number of masks required for fabrication and simplifies the manufacturing process.

In one embodiment, a flat panel display includes a substrate, and a plurality of signal lines arranged on the substrate and crossed with one another. A unit pixel region defined by each crossing arrangement of the signal lines has a pixel driving circuit region and an emission region. A pixel driving TFT is positioned in the pixel driving circuit region and includes a semiconductor layer having a first end and a second end, and a gate electrode that corresponds to a predetermined portion of the semiconductor layer and is formed on the same layer as the signal lines. A pixel electrode is electrically connected to the pixel driving TFT and positioned in the emission region.

The pixel driving TFT may further include a source/drain electrode that is simultaneously connected to the second end of the semiconductor layer and any one of the signal lines. The signal line connected to the source/drain electrode may be a common power line.

The pixel electrode may be directly connected to the first end of the semiconductor layer in order to provide an electrical connection to the pixel driving TFT. The pixel electrode and the source/drain electrode may be formed of the same material. In addition, the pixel electrode and the source/drain electrode may have a stacked structure of one conductive layer.

The pixel driving TFT may further include a low-resistance electrode that is simultaneously connected to the first end of the semiconductor layer and the pixel electrode, and the pixel electrode may be electrically connected to the pixel driving TFT through the low-resistance electrode. The low-resistance electrode and the source/drain electrode may be made of the same material. Alternatively, the low-resistance electrode and the source/drain electrode may be made of a material selected from a group consisting of Al, an Al alloy, Mo, and a Mo alloy.

The gate electrode may be positioned on the semiconductor layer, and the flat panel display may further comprise a gate insulating layer interposed between the semiconductor layer and the gate electrode, and an interlayer positioned on the gate electrode to cover the gate electrode and the signal lines. The interlayer may be one of an organic layer, an inorganic layer, and an organic and inorganic compound layer.

The flat panel display may further include a capacitor including a lower electrode positioned on the same layer as the semiconductor layer, and an upper electrode positioned on the same layer as the gate electrode.

In a crossing region of the signal lines, a first signal line among the signal lines may include a plurality of first signal patterns separated on both sides of a second signal line, and an interconnection line connected to the first signal patterns, respectively and insulated from the second signal line.

The flat panel display may further comprise an organic functional layer positioned on the pixel electrode and having at least an organic emission layer.

Another embodiment of the present invention, provides a method for fabricating a flat panel display. The method for fabricating the flat panel display where a unit pixel region is defined by crossing arrangement of a plurality of signal lines, may include: providing a substrate having the unit pixel region with a pixel driving circuit region and an emission region formed within the unit pixel region. The method may further include: forming a semiconductor layer having a first end and a second end on the pixel driving circuit region, forming a gate insulating layer for covering the semiconductor layer, and depositing a gate electrode material on the gate insulating layer. The gate electrode material may then be patterned to form a gate electrode corresponding to a predetermined portion of the semiconductor layer. In one embodiment, the signal lines are formed at the same time.

The method may further include: forming an interlayer for covering the gate electrode and the signal lines, forming first and second source/drain contact holes for exposing the first and second ends of the semiconductor layer within the interlayer, respectively, and depositing a pixel electrode material on the substrate including the contact holes. The method may further include patterning the pixel electrode material to simultaneously form a pixel electrode positioned on the interlayer and connected to the first end of the semiconductor layer through the first source/drain contact hole, and a source/drain electrode connected to the second end of the semiconductor layer through the second source/drain contact hole.

Alternatively, the method may further include: forming an interlayer for covering the gate electrode and the signal lines, forming the first and second source/drain contact holes for exposing the first and second ends of the semiconductor layer within the interlayer, respectively, and depositing a low-resistance material on the substrate where the contact holes are already formed. The method may further include the step of patterning the low resistance material to simultaneously form a low-resistance electrode connected to the first end of the semiconductor layer through the first source/drain contact hole and a source/drain electrode connected to the second end of the semiconductor layer through the second source/drain contact hole. The method may also include the step of depositing a pixel electrode material on the substrate where the low-resistance electrode and the source/drain electrode are already formed, and pattering the pixel electrode material to form a pixel electrode connected to the low-resistance electrode.

BRIEF DESCRIPTION OF THE DRAWINGS

The above and other features and advantages of the present invention will become more apparent to those of ordinary skill in the art by describing in detail preferred embodiments thereof with reference to the attached drawings.

FIG. 4A and FIG. 4B are cross-sectional views taken along the line 1-1 of FIG. 3 that illustrate an OLED and method for fabricating the same, according to the first embodiment of the present invention.

DETAILED DESCRIPTION OF THE INVENTION

Figure 1:
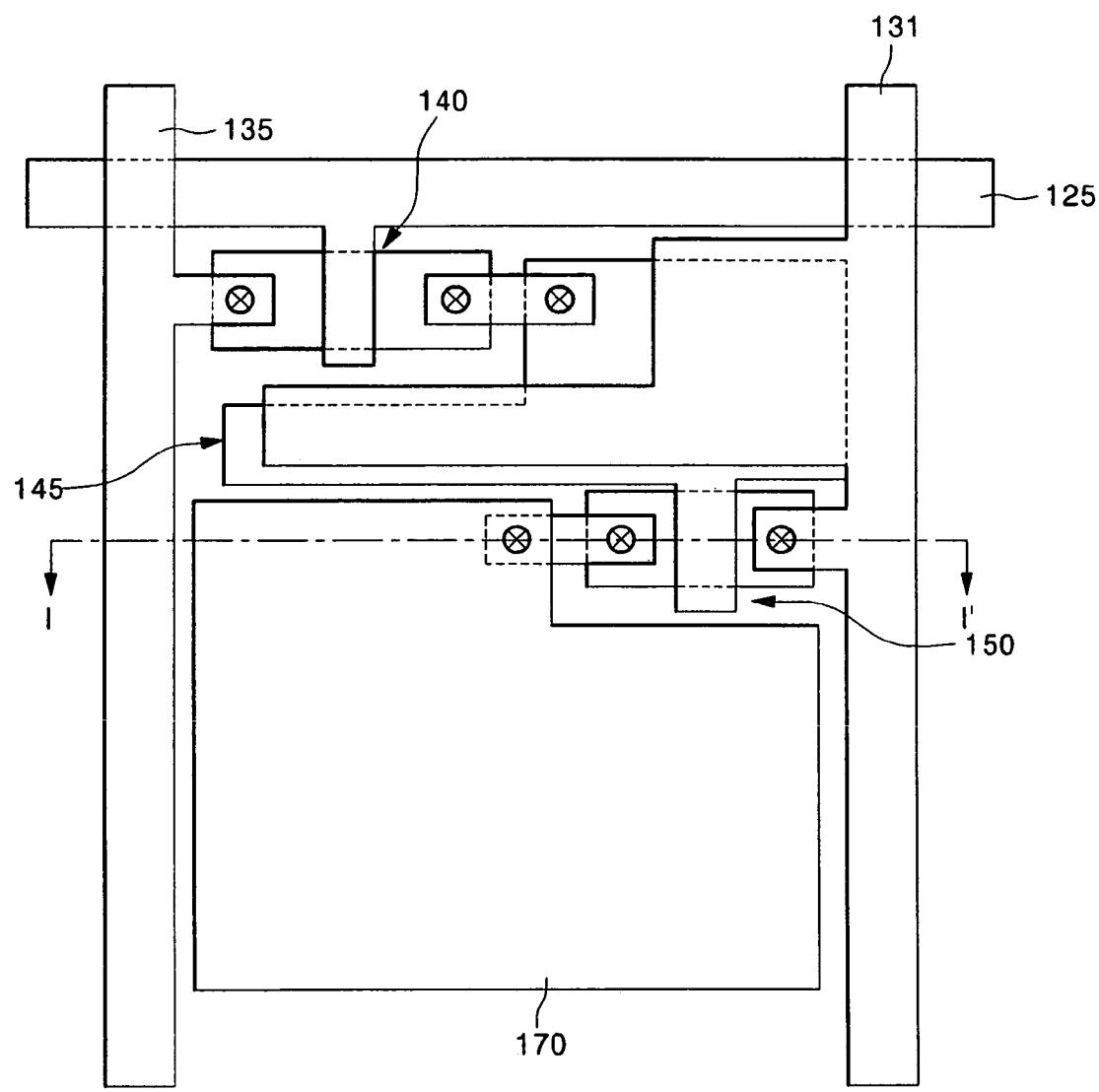
FIG. 1 shows a plan view for illustrating a conventional active matrix OLED.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, when a layer is described to be formed on other layer or on a substrate, which means that the layer may be formed on the other layer or on the substrate, or a third layer may be interposed between the layer and the other layer or the substrate. Like numbers refer to like elements throughout the specification.

Figure 3:
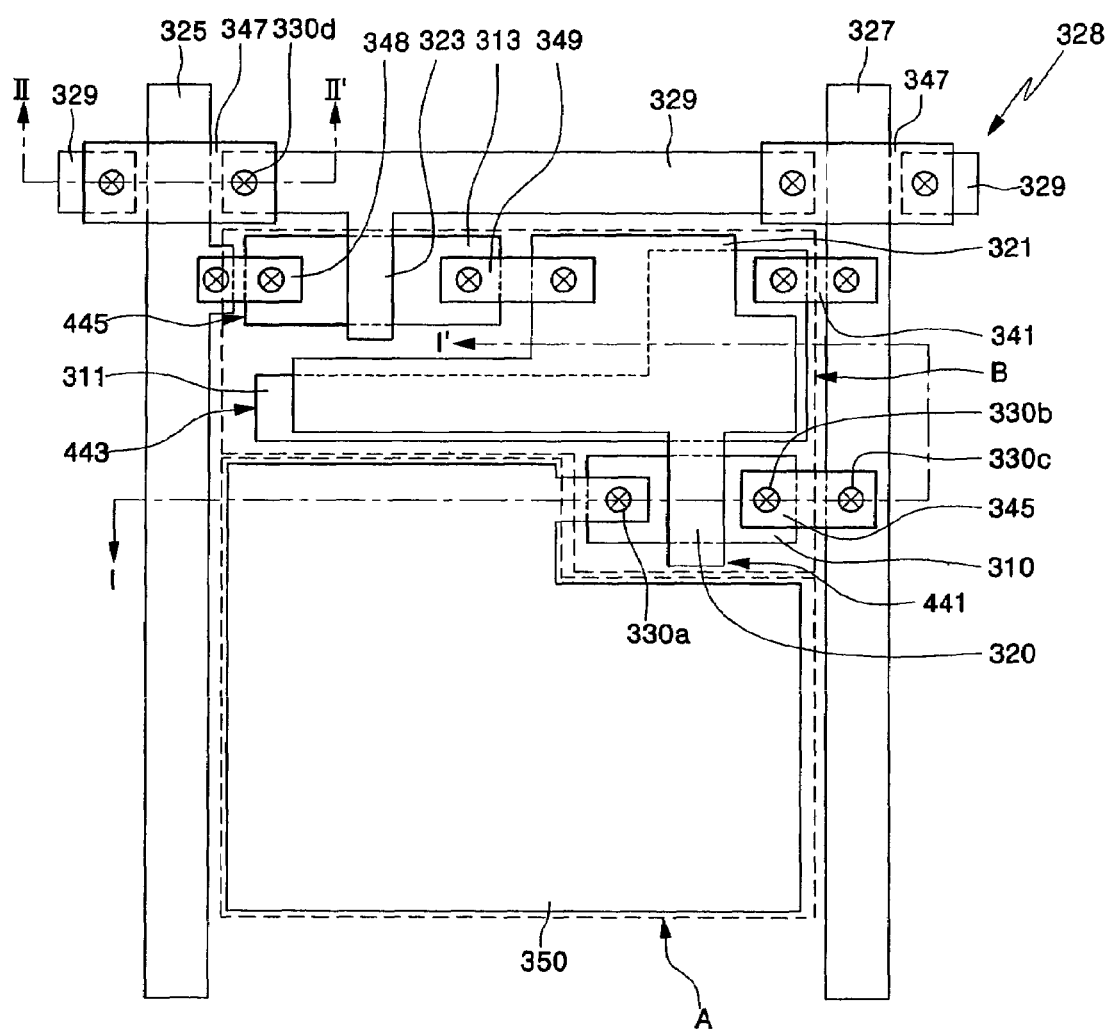
FIG. 3 shows a plan view of an OLED in accordance with first and second embodiments of the present invention.

FIG. 3 shows a plan view of a unit pixel region of an OLED in accordance with first and second embodiments of the present invention.

Referring to FIG. 3, a unit pixel region is defined by signal lines that are arranged to cross one another on a substrate. These signal lines include a data line 325 arranged in one direction, a common power line 327 spaced apart from the data line 325 by a predetermined distance and placed in parallel with the data line 325, and a scan line 328 that crosses the data line 325 and the common power line 327. In a crossing region between the scan line 328 and the data line 325 or between the scan line 328 and the common power line 327, the scan line 328 includes scan line patterns 329 positioned on both sides of the data line 325 or the common power line 327 so as to be separated from each other, and interconnection lines 347 connected to the scan line patterns 329 through wiring contact holes 330d and insulated from the data line 325 or the common power line 327. The scan line 328 selects a unit pixel to be driven, and the data line 325 applies a data signal to the selected unit pixel.

The unit pixel region consists of an emission region A and a pixel driving circuit region B. An organic light emitting diode is formed in the emission region A. In addition, a switching TFT 445 for switching the data signal applied to the data line 325 in response to the signal applied to the scan line, a capacitor 443 for maintaining the data signal applied through the switching TFT 445 for a predetermined period, and a pixel driving TFT 441 for applying a driving signal to the organic light emitting diode by means of the data signal applied through the switching TFT 445 are formed in the pixel driving circuit region B.

The organic light emitting diode includes a pixel electrode 350, an organic functional layer (not shown) containing the organic emission layer formed on the pixel electrode 350, and an opposite electrode (not shown). The pixel driving TFT 441 includes a semiconductor layer 310, a gate electrode 320, and a source/drain electrode 345. The pixel electrode 350 is extended to the pixel driving circuit region B to be connected to a first end of the semiconductor layer 310 through a first source/drain contact hole 330*a*. In addition, the source/drain electrode 345 is connected to the common power line 327 through a connection contact hole 330*c* and is simulatenously connected to a second end of the semiconductor layer 310 through a second source/drain contact hole 330*b*.

In contrast, the pixel driving TFT 441 may include the semiconductor layer 310, the gate electrode 320, a low-resistance electrode (not shown), and the source/drain electrode 345. In this embodiment, the low-resistance electrode is positioned beneath the pixel electrode 350 and connected to both of the pixel electrode 350 and the first end of the semiconductor layer 310.

The capacitor 443 includes an upper electrode 321 connected to the gate electrode 320 of the pixel driving TFT 441, and a lower electrode 311. The lower electrode 311 is electrically connected to the common power line 327 through the contact holes and a capacitor interconnection line 341. The switching TFT 445 includes a gate electrode 323 connected to the scan line, a semiconductor layer 313, a source/drain electrode 349 connected to the upper electrode 321 of the capacitor 443 and one end of the semiconductor layer 313 through contact holes, respectively, and a source/drain electrode 348 connected to the data line 325 and the other end of the semiconductor layer 313 through contact holes, respectively.

Figure 4A:
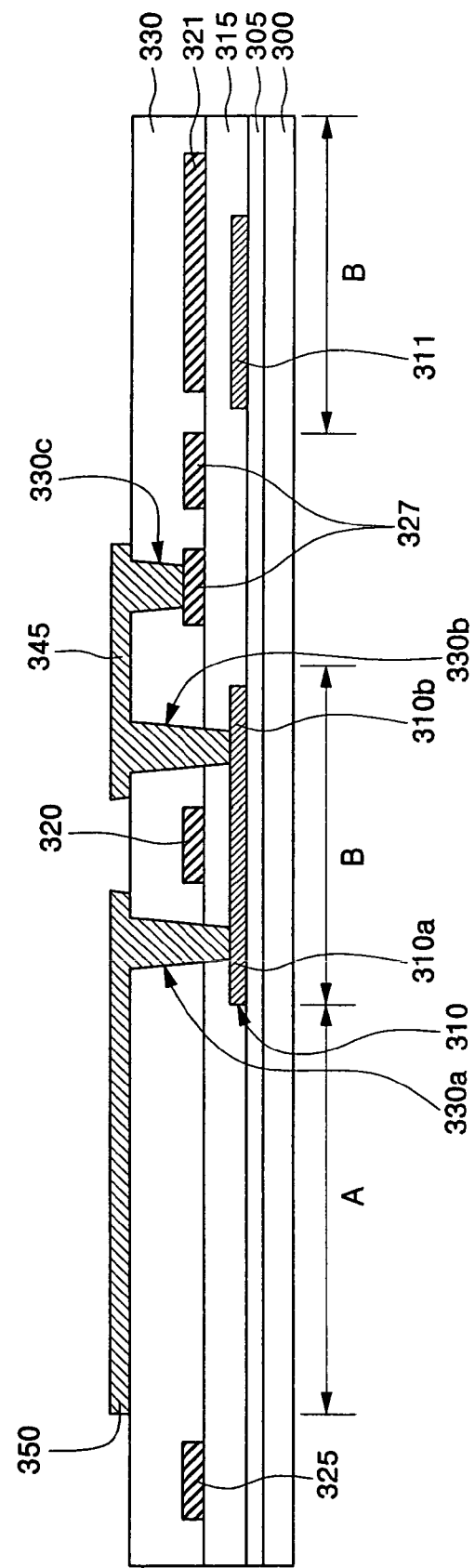
Figure 5A:
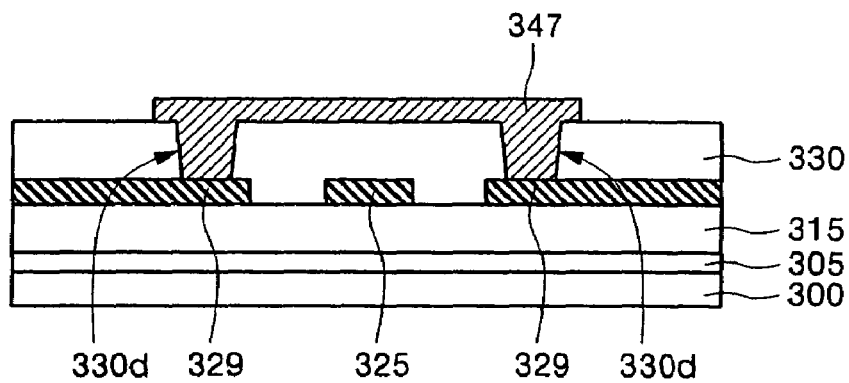
FIG. 5A and FIG. 5B are cross-sectional views taken along the line 1-1 of FIG. 3 that illustrate the OLED and method for fabricating the same, according to the first embodiment of the present invention.
Figure 5B:
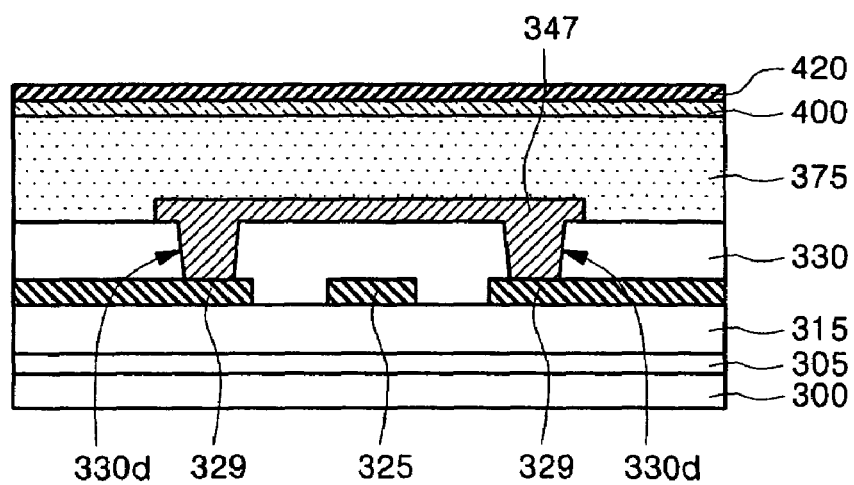

FIG. 4A and FIG. 4B are cross-sectional views taken along the line I-I's of FIG. 3 that illustrate a method for fabricating the OLED according to one embodiment of the present invention. FIG. 5A and FIG. 5B are cross-sectional views taken along the line II-II of FIG. 3 that illustrate a method for fabricating the OLED in accordance with the one embodiment of the present invention.

Referring to FIG. 4A and FIG. 5A, a substrate 300 is provided that includes the emission region A, the pixel driving circuit region B, and a signal line region that excludes the emission region A and the pixel driving circuit region B. The substrate 300 may be formed of glass or plastic. A buffer layer 305 is formed on the substrate 300. The buffer layer 305 acts to protect a TFT to be formed in a subsequent process from impurities such as alkali ions that flow out of the substrate 300, and may be formed of a silicon oxide layer or a silicon nitride layer.

It is preferable to deposit an amorphous silicon layer on the buffer layer 305 of the pixel driving circuit region B and crystallize it to thereby form a polycrystalline silicon layer. The polycrystalline silicon layer is patterned using a first mask to form a semiconductor layer 310 including a first end 310*a* and a second end 310*b*, and a lower electrode 311. A gate insulating layer 315 may then be formed on an entire surface including the semiconductor layer 310 and the lower electrode 311. The amorphous silicon layer may be crystallized using Excimer Laser Annealing (ELA), Sequential Lateral Solidification (SLS), Metal Induced Crystallization (MIC), or Metal Induced Lateral Crystallization (MILC).

Subsequently, a gate electrode material is deposited on the gate insulating layer 315 and patterned using a second mask, so that a gate electrode 320 is formed to correspond to a predetermined portion of the semiconductor layer 310. An upper electrode 321 corresponding to the lower electrode 311 is formed while the gate electrode 320 is formed. Additionally, a data line 325, a common power line 327, and a scan line pattern 329 are formed on the signal line region. As a result, the gate electrode 320 and signal lines, namely the data line 325, the common power line 327 and the scan line pattern 329, are formed in the same layer. The gate electrode material is preferably one selected from a group consisting of Al, Al alloy, Mo, and Mo alloy. More preferably, the gate electrode material is a molybdenum-tungsten (Mo—W) alloy.

An interlayer 330 may then be formed to cover the gate electrode 320, the upper electrode 321, the data line 325, the common power line 327, and the scan line pattern 329. The interlayer 330 may be formed of an organic layer, an inorganic layer, or an organic and inorganic composite layer. The interlayer 330 is preferably formed of the organic and inorganic composite layer by stacking the organic layer on the inorganic layer. The organic layer is preferably a BCB (benzocyclobutene) layer, and the inorganic layer is preferably a silicon oxide layer or a silicon nitride layer.

Next, by means of a third mask, a first source/drain contact hole 330*a* and a second source/drain contact hole 330*b* are formed within the interlayer 330 and the gate insulating layer 315 to expose the first end 310*a* and the second end 310*b* of the semiconductor layer 310, respectively. Concurrently, a connection contact hole 330*c* for exposing the common power line 327 of the signal line region, and a wiring contact hole 330*d* for exposing the scan line patterns 329 positioned at both sides of the data line 325 are formed within the interlayer 330.

A pixel electrode material is deposited on the substrate where the contact holes 330*a*, 330*b*, 330*c*, and 330*d* are formed, and patterned using a fourth mask to thereby form a pixel electrode 350, a source/drain electrode 345 and interconnection lines 347. The pixel electrode 350 is positioned on the interlayer 330 of the emission region A and extended to the pixel driving circuit region B to be directly connected to the first end 310*a* of the semiconductor layer 310 through the first source/drain contact hole 330*a*. The source/drain electrode 345 is positioned on the interlayer 330 of the pixel driving circuit region B, so that it is connected to the second end 310*b* of the semiconductor layer 310 through the second source/drain contact hole 330*b* and extended to the signal line region for connection to the common power line 327 through the contact hole 330*c*. As a result, a pixel driving TFT is formed to include the semiconductor layer 310, the gate electrode 320, the pixel electrode 350 of the pixel driving circuit region B, and the source/drain electrode 345.

The interconnection lines 347 are positioned on the interlayer 330 on the signal line region and insulated from the data line 325, and connected to the scan line patterns 329 through the wiring contact holes 330*d*, respectively.

The pixel electrode material may be Indium Tin Oxide (ITO) or Indium Zinc Oxide (IZO). Alternatively, the pixel electrode material may be Mg, Ca, Al, Ag, Ba, or alloy thereof. In this case, the pixel electrode 350 and the source/drain electrode 345 are formed to be a stacked structure of one conductive layer. Alternatively, the pixel electrode material may contain a first pixel electrode material and a second pixel electrode material stacked on the first pixel electrode material. In this case, the pixel electrode 350 and the source/drain electrode 345 are formed to be a stacked structure of two conductive layers. The first pixel electrode material is preferably AlNd, and the second pixel electrode material is preferably ITO or IZO. Alternatively, the pixel electrode 350 and the source/drain electrode 345 may be formed to be a stacked structure of three or more conductive layers by depositing pixel electrode materials not less than three materials in order.

Referring to FIG. 4B and FIG. 5B, it is preferable to form a pixel defining layer 375 for covering the pixel electrode 350, the source/drain electrode 345 and the interconnection lines 347. The pixel defining layer 375 may be formed of one selected from a group consisting of BCB, acrylic based polymer, and polyimide.

Next, an opening 375a is formed to expose the pixel electrode 350 of the emission region A within the pixel defining layer 375 using a fifth mask. An organic functional layer 400 may then be formed to include at least organic emission layer on the pixel electrode 350 exposed within the opening 375a. The organic functional layer 400 may preferably include at least one selected from a group consisting of a hole injection layer (HIL), a hole transporting layer (HTL), a hole blocking layer (HBL), an electron transporting layer (ETL), and an electron injecting layer (EIL). An opposite electrode 420 may then be formed on the organic functional layer 400. As a result, an organic light emitting diode 440 is fabricated to have the pixel electrode 350, the opposite electrode 420, and the organic functional layer 400 interposed between the pixel electrode and the opposite electrode.

Figure 2:
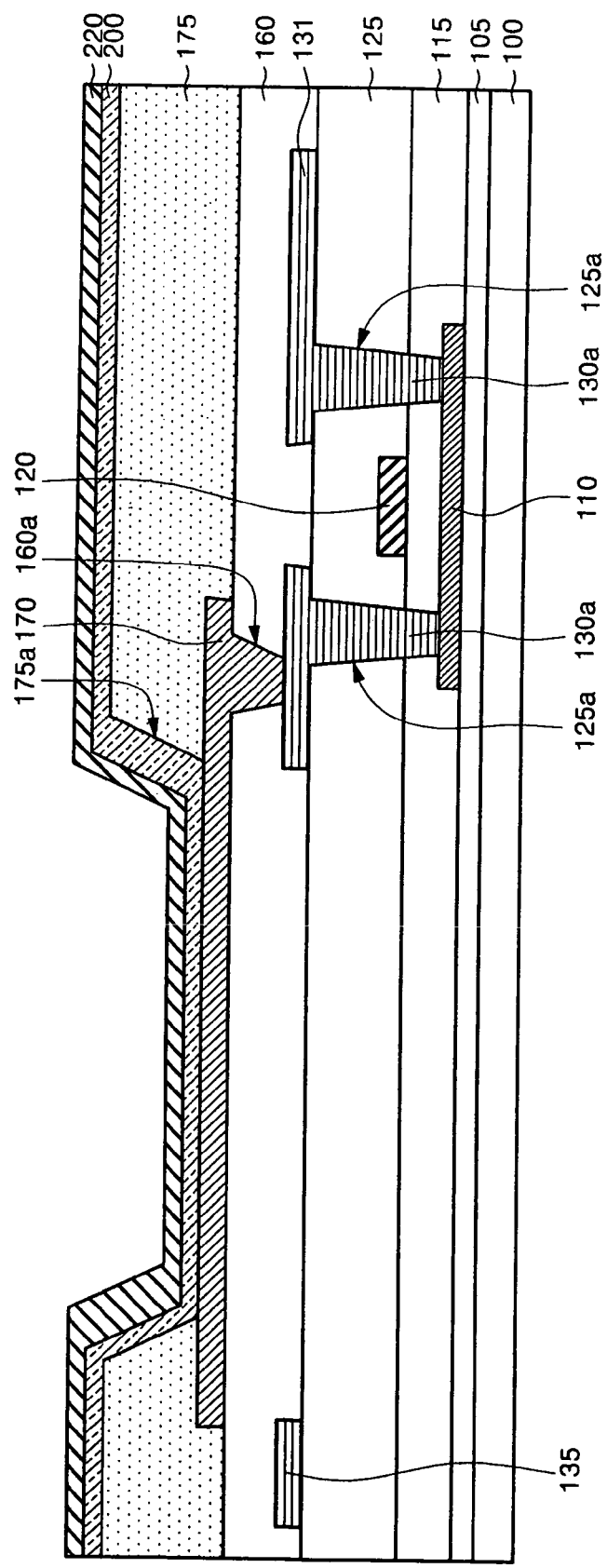
FIG. 2 shows a cross-sectional view for illustrating a method for fabricating the OLED taken along the line 1-1 of FIG. 1 in accordance with the prior art.

In the embodiment described above, five masks are used in total to fabricate the OLED. In addition, the pixel electrode 350 is formed to be directly connected to the semiconductor layer 310 of the pixel driving TFT through the first source/drain contact hole 330a, which allows elimination of the process of forming the via hole (160a of FIG. 2) and the process of forming the via hole insulating layer (160 of FIG. 2) where the via hole 160a is placed.

Figure 6A:
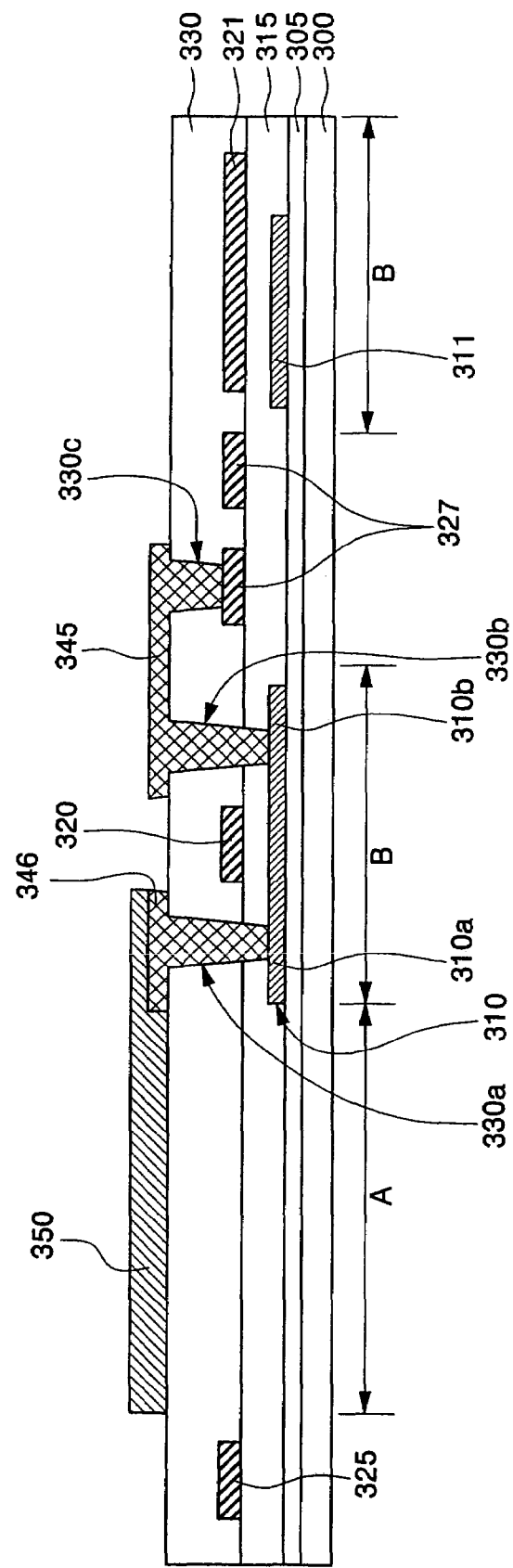
FIG. 6A and FIG. 6B are cross-sectional views taken along the line 1-1 of FIG. 3 that illustrate the OLED and method for fabricating the same, according to the second embodiment of the present invention.
Figure 6B:
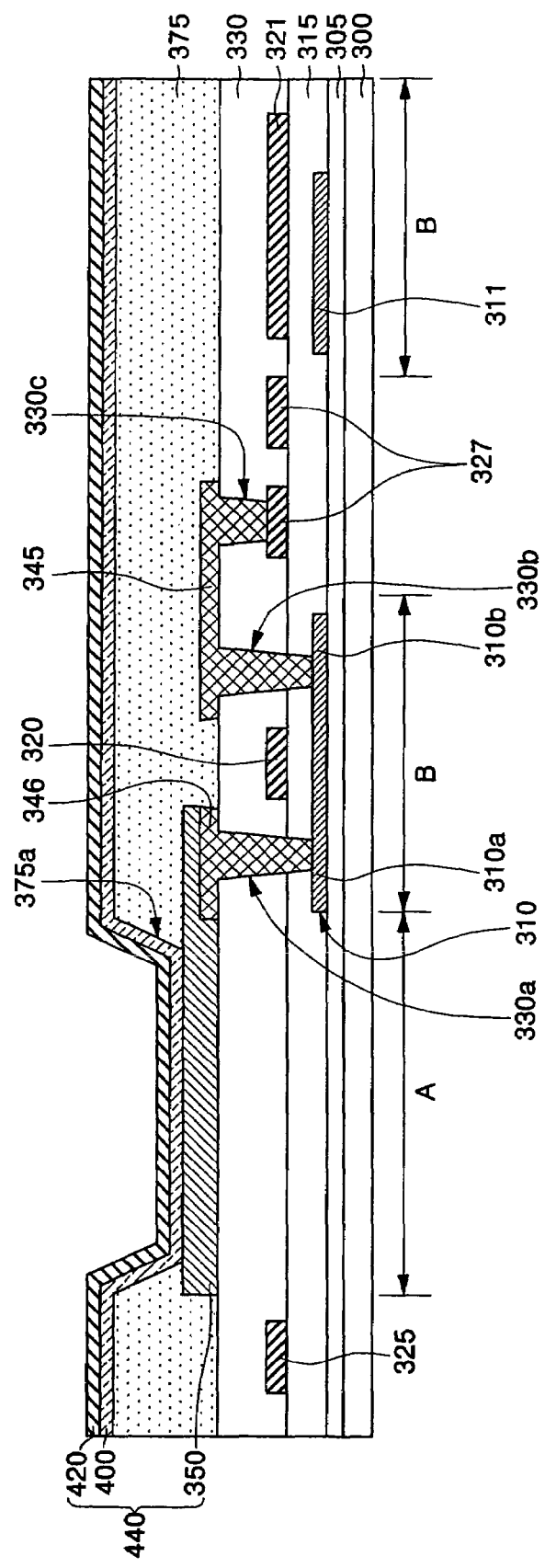
Figure 7A:
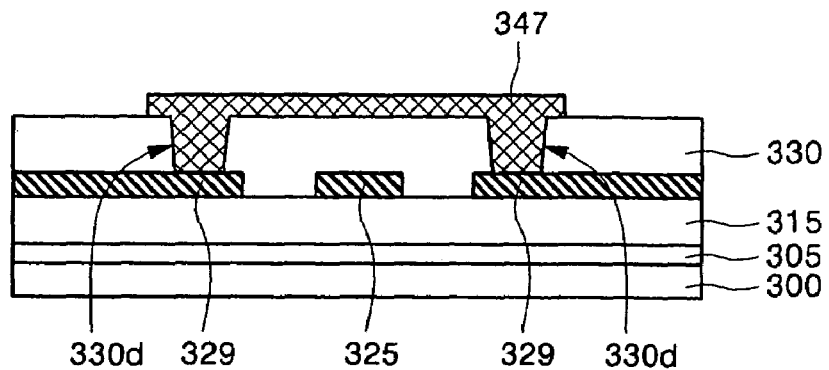
FIG. 7A and FIG. 7B are cross-sectional views taken along the line 1-1 of FIG. 3 that illustrate the OLED and method for fabricating the same, according to the second embodiment of the present invention.
Figure 7B:
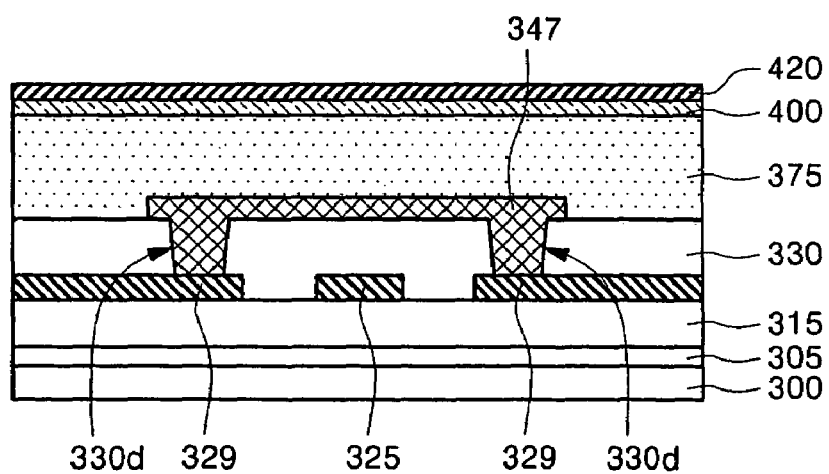

FIG. 6A and FIG. 6B are cross-sectional views taken along the line I-I's of FIG. 3 that illustrate a method for fabricating the OLED in accordance with the second embodiment of the present invention. FIG. 7A and FIG. 7B are cross-sectional views taken along the line II-II's of FIG. 3 that illustrate a method for fabricating the OLED in accordance with the second embodiment of the present invention.

Referring to FIG. 6A and FIG. 7A, a substrate 300 is provided that includes an emission region A, a pixel driving circuit region B, and an signal line region excluding the emission region A and the pixel driving circuit region B. The substrate 300 may be formed of glass or plastic. A buffer layer 305 is formed on the substrate 300. The buffer layer 305 acts to protect a TFT to be formed in a subsequent process from impurities such as alkali ions that flow out of the substrate 300, and may be formed of a silicon oxide layer or a silicon nitride layer.

It is preferable to deposit an amorphous silicon layer on the buffer layer 305 of the pixel driving circuit region B and crystallize it to thereby form a polycrystalline silicon layer. The polycrystalline silicon layer is patterned using a first mask to form the semiconductor layer including a first end 310a and a second end 310b, and the lower electrode 311. A gate insulating layer 315 may then be formed on an entire surface including the semiconductor layer 310 and the lower electrode 311. The amorphous silicon layer may be crystallized using Excimer Laser Annealing (ELA), Sequential Lateral Solidification (SLS), Metal Induced Crystallization (MIC), or Metal Induced Lateral Crystallization (MILC).

Subsequently, a gate electrode material is deposited on the gate insulating layer 315 and patterned using a second mask, so that a gate electrode 320 is formed to correspond to a predetermined portion of the semiconductor layer 310. An upper electrode 321 corresponding to the lower electrode 311 is formed while the gate electrode 320 is formed. Additionally, a data line 325, a common power line 327, and a scan line pattern 329 are formed on the signal line region. As a result, the gate electrode 320 and the signal lines, namely the data line 325, the common power line 327 and the scan line pattern 329 are formed in the same layer. The gate electrode material is preferably one selected from a group consisting of Al, Al alloy, Mo, and Mo alloy. More preferably, the gate electrode material is a molybdenum-tungsten (Mo—W) alloy.

An interlayer 330 may then be formed to cover the gate electrode 320, the upper electrode 321, the data line 325, the common power line 327, and the scan line pattern 329. The interlayer 330 may be preferably formed of an organic layer, an inorganic layer, or an organic and inorganic composite layer. The interlayer 330 may be preferably formed of the organic and inorganic composite layer by stacking the organic layer on the inorganic layer. The organic layer is preferably a BCB (benzocyclobutene) layer, and the inorganic layer is preferably a silicon oxide layer or a silicon nitride layer.

Next, by means of a third mask, a first source/drain contact hole 330a and a second source/drain contact hole 330b are formed within the interlayer 330 and the gate insulating layer 315 to expose a first end 310a and a second end 310b of the semiconductor layer 310, respectively. Concurrently, a connection contact hole 330c for exposing the common power line 327 of the signal line region, and wiring contact holes 330d for exposing the scan line patterns 329 positioned at both sides of the data line 325 are formed within the interlayer 330.

A low-resistance material is deposited on the substrate where the contact holes 330a, 330b, 330c and 330d are formed, and patterned using a fourth mask to thereby form a low-resistance electrode 346, a source/drain electrode 345, and interconnection lines 347. The low-resistance electrode 346 is positioned on the interlayer of the pixel driving circuit region B to be connected to the first end 310a of the semiconductor layer 310 through the first source/drain contact hole 330a. Alternatively, the lower resistance electrode 346 may be formed to be extended onto the interlayer 330 of the emission region A. The source/drain electrode 345 is positioned on the interlayer 330 of the pixel driving circuit region B, which is connected to the second end 310b of the semiconductor layer 310 through the second source/drain contact hole 330b, and at the same time extended to the signal line region for connection to the common power line 327 through the connection contact hole 330c. As result, a pixel driving TFT is fabricated to include the semiconductor layer 310, the gate electrode 320, the low-resistance electrode 346, and the source/drain electrode 345.

The interconnection lines 347 are formed on the interlayer 330 of the signal line region and insulated from the data line 325, and are also connected to the scan line patterns 329 through the wiring contact holes 330d, respectively.

The low-resistance material has a specific resistance lower than ITO, and is preferably one selected from a group consisting of Al, Al alloy, Mo, and Mo alloy. More preferably, it is a Mo—W alloy. As such, the low-resistance electrode 346, the source/drain electrode 345 and the interconnection lines 347 may be formed using the lower resistance material mentioned above, which allows contact resistance and interconnection resistance to be reduced as compared to the first embodiment.

Next, a pixel electrode 350 is formed on the interlayer 330 of the emission region A using a fifth mask. The pixel electrode 350 may be formed by vacuum depositing a pixel electrode material using a shadow mask (i.e., the fifth mask) or by stacking the pixel electrode material on the entire surface of the substrate and patterning it by means of a photomask (i.e. the fifth mask). The pixel electrode 350 is formed to be connected to the low-resistance electrode 346 on the interlayer 330. When the low-resistance electrode 346 is extended to the emission region A, the pixel electrode 350 may be preferably formed on the low-resistance electrode 346.

The pixel electrode material may be Indium Tin Oxide (ITO) or Indium Zinc Oxide (IZO). Alternatively, the pixel electrode material may be Mg, Ca, Al, Ag, Ba, or alloy thereof. In this case, the pixel electrode 350 is formed to be a stacked structure of one conductive layer. Alternatively, the pixel electrode material may contain a first pixel electrode material and a second pixel electrode material stacked on the first pixel electrode material. In this case, the pixel electrode 350 is formed to be a stacked structure of two conductive layers. The first pixel electrode material is preferably AlNd, and the second pixel electrode material is preferably ITO or IZO.

Referring to FIG. 6B and FIG. 7B, it is preferable to form a pixel defining layer 375 for covering the pixel electrode 350, the low-resistance electrode 346, the source/drain electrode 345 and the interconnection lines 347. The pixel defining layer 375 may be formed of one selected from a group consisting of BCB, acrylic based polymer, and polyimide.

Next, an opening 375a is formed to expose the pixel electrode 350 of the emission region A within the pixel defining layer 375 using a sixth mask. An organic functional layer 400 may then be formed to include at least organic emission layer on the pixel electrode 350 exposed within the opening 375a. The organic functional layer 400 may preferably include at least one selected from a group consisting of a hole injection layer (HIL), a hole transporting layer (HTL), a hole blocking layer (HBL), an electron transporting layer (ETL), and an electron injecting layer (EIL). An opposite electrode 420 may then be formed on the organic functional layer 400. As a result, an organic light emitting diode 440 is fabricated to have the pixel electrode 350, the opposite electrode 420, and the organic functional layer 400 interposed between the pixel electrode 350 and the opposite electrode 420.

In the present embodiment, six masks are used in total to fabricate the OLED. In addition, the pixel electrode 350 is formed to be connected to the low-resistance electrode 346 on the interlayer 330, which allows elimination of both the process of forming the via hole (160a of FIG. 2) and the process of forming the via hole insulating layer (160 of FIG. 2) where the via hole 160a is placed.

In accordance with the above-mentioned present invention, a flat panel display may be fabricated using a reduced number of masks. Additionally, the process of forming the via hole for electrically connecting the pixel electrode to the pixel driving TFT and the process of forming the via hole insulating layer where the via hole is placed may be eliminated.

What is claimed is:

1. A flat panel display, comprising:
   a substrate;
   a plurality of signal lines arranged on the substrate, the signal lines comprising a data line, a common power line, and a scan line, wherein the data line and the common power line are arranged substantially parallel with each other and crossing the scan line;
   a unit pixel region defined by a crossing arrangement of the signal lines and having a pixel driving circuit region and an emission region;
   a pixel driving TFT positioned in the pixel driving circuit region, the pixel driving TFT including a semiconductor layer having a first end and a second end, and a gate electrode that corresponds to a predetermined portion of the semiconductor layer, wherein the gate electrode is formed in a same layer with one of the entire data line and the common power line;
   a pixel electrode electrically connected to the pixel driving TFT and positioned in the emission region; and
   a capacitor comprising a lower electrode arranged in a same layer as the semiconductor layer and an upper electrode arranged in the same layer as the gate electrode, the lower electrode being separated from the semiconductor layer and connected to the common power line through a capacitor interconnection line arranged in a same layer as the pixel electrode,
   wherein the common power line transmits a common voltage for driving the pixel electrode.

2. The flat panel display of claim 1, wherein the pixel driving TFT further includes a source/drain electrode that is simultaneously connected to the second end of the semiconductor layer and the data line or the common power line.

3. The flat panel display of claim 2, wherein the signal line connected to the source/drain electrode is the common power line.

4. The flat panel display of claim 1, wherein the pixel electrode is directly connected to the first end of the semiconductor layer to provide an electrical connection to the pixel driving TFT.

5. The flat panel display of claim 4, wherein the pixel driving TFT further includes a source/drain electrode that is simultaneously connected to the second end of the semiconductor layer and the data line or the common power line.

6. The flat panel display of claim 5, wherein the signal line connected to the source/drain electrode is the common power line.

7. The flat panel display of claim 5, wherein the pixel electrode and the source/drain electrode are formed of a same material.

8. The flat panel display of claim 5, wherein the pixel electrode and the source/drain electrode have a stacked structure of at least one conductive layer.

9. The flat panel display of claim 1, wherein the pixel driving TFT further includes a low-resistance electrode that is simultaneously connected to the first end of the semiconductor layer and the pixel electrode, and wherein the pixel electrode is electrically connected to the pixel driving TFT through the low-resistance electrode.

10. The flat panel display of claim 9, wherein the pixel driving TFT further includes a source/drain electrode that is simultaneously connected to the second end of the semiconductor layer and any one of the signal lines.

11. The flat panel display of claim 10, wherein the signal line connected to the source/drain electrode is a common power line.

12. The flat panel display of claim 10, wherein the low-resistance electrode and the source/drain electrode are formed of a same material.

13. The flat panel display of claim 12, wherein the low-resistance electrode and the source/drain electrode are formed of one selected from a group consisting of Al, Al alloy, Mo, and Mo alloy.

14. The flat panel display of claim 1, wherein the gate electrode is positioned on the semiconductor layer; and
   the flat panel display further comprises:
   a gate insulating layer interposed between the semiconductor layer and the gate electrode; and
   an interlayer positioned on the gate electrode to cover the gate electrode and the signal lines.

15. The flat panel display of claim 14, wherein the interlayer is one of an organic layer, an inorganic layer, and an organic and inorganic composite layer.

16. The flat panel display of claim 15, wherein the organic and inorganic composite layer is structured such that the inorganic layer and the organic layer are stacked in order.

17. The flat panel display of claim 15, wherein the inorganic layer is a silicon oxide layer or a silicon nitride layer.

18. The flat panel display of claim 15, wherein the organic layer is a BLB (benzocyclobutene) layer.

19. The flat panel display of claim 1, wherein a first signal line among the signal lines comprises:
a plurality of first signal patterns separated on both sides of a second signal line; and
an interconnection line in a crossing region of the signal lines, the interconnection line connected to the first signal patterns separated on both sides of the second signal line and insulated from the second signal line.

20. The flat panel display of claim 1, further comprising:
an organic functional layer positioned on the pixel electrode and having at least an organic emission layer.

21. A flat panel display, comprising:
a substrate;
a semiconductor layer positioned on a predetermined region of the substrate and having a first end and a second end;
a gate insulating layer positioned on the semiconductor layer;
a gate electrode positioned on the gate insulating layer;
a plurality of signal lines comprising a data line, a common power line, and a scan line, wherein the data line and the common power line are arranged substantially parallel with each other and crossing the scan line;
an interlayer for covering the gate electrode and the signal lines and having a first source/drain contact hole to expose the first end of the semiconductor layer;
a pixel electrode positioned on the interlayer and electrically connected to the first end of the semiconductor layer through the first source/drain contact hole; and
a capacitor comprising a lower electrode arranged in a same layer as the semiconductor layer and an upper electrode arranged in a same layer as the gate electrode, the lower electrode being separated from the semiconductor layer and connected to the common power line through a capacitor interconnection line arranged in a same layer as the pixel electrode,
wherein one of the entire data line and the common power line is arranged in the same layer as the gate electrode, and the common power line transmits a common voltage for driving the pixel electrode.

22. The flat panel display of claim 21, further comprising:
a connection contact hole in the interlayer for exposing the common power line;
a second source/drain contact hole in the interlayer for exposing the second end of the semiconductor layer; and
a source/drain electrode connected to the common power line through the connection contact hole and connected to the second end of the semiconductor layer through the second source/drain contact hole.

23. The flat panel display of claim 21, wherein the pixel electrode is directly connected to the first end of the semiconductor layer through the first source/drain contact hole.

24. The flat panel display of claim 23, further comprising a low-resistance electrode positioned beneath the pixel electrode and directly connected to the first end of the semiconductor layer through the first source/drain contact hole, wherein the pixel electrode is coupled to the first end of the semiconductor layer through the low-resistance electrode.

* * * * *